United States Patent
Yuan

(10) Patent No.: US 10,866,267 B2
(45) Date of Patent: Dec. 15, 2020

(54) ELECTRIC CURRENT SENSOR

(71) Applicant: Fu-Te Yuan, New Taipei (TW)

(72) Inventor: Fu-Te Yuan, New Taipei (TW)

(73) Assignee: iSentekInc., New Taipei (TW)

( * ) Notice: Subject to any disclaimer, the term of this patent is extended or adjusted under 35 U.S.C. 154(b) by 6 days.

(21) Appl. No.: 16/527,075

(22) Filed: Jul. 31, 2019

(65) Prior Publication Data

US 2020/0064378 A1    Feb. 27, 2020

Related U.S. Application Data

(60) Provisional application No. 62/721,624, filed on Aug. 23, 2018.

(30) Foreign Application Priority Data

May 9, 2019   (TW) ............................. 108116112 A

(51) Int. Cl.
   *G01R 15/20*   (2006.01)
(52) U.S. Cl.
   CPC .................................. *G01R 15/205* (2013.01)
(58) Field of Classification Search
   CPC ...... G01R 31/40; G01R 31/42; G01R 31/025; G01R 19/2513; G01R 19/0092; G01R 31/00; G01R 31/3275; G01R 15/205; G01R 17/10; G01R 15/18
   USPC .......................... 324/117 R, 764.01, 500, 537
   See application file for complete search history.

(56) References Cited

U.S. PATENT DOCUMENTS

| | | | |
|---|---|---|---|
| 8,583,388 B2 * | 11/2013 | Yaguchi ................ | G06F 30/367 |
| | | | 702/60 |
| 9,933,506 B2 | 4/2018 | Jost et al. | |
| 2017/0059360 A1 | 3/2017 | Zimmer et al. | |
| 2020/0064379 A1 * | 2/2020 | Yuan ..................... | G01R 15/205 |
| 2020/0300937 A1 * | 9/2020 | Yuan ...................... | G01R 33/09 |

FOREIGN PATENT DOCUMENTS

| | | |
|---|---|---|
| CN | 200959021 | 10/2007 |
| TW | 331592 | 5/1998 |
| TW | 201818050 | 5/2018 |

OTHER PUBLICATIONS

"Office Action of Taiwan Counterpart Application", dated Jan. 22, 2020, p. 1-p. 8.

* cited by examiner

*Primary Examiner* — Giovanni Astacio-Oquendo
(74) *Attorney, Agent, or Firm* — JCIPRNET

(57) ABSTRACT

An electric current sensor includes a substrate, a conductive wire, a first anisotropic magnetoresistor (AMR) unit, a second AMR unit, a third AMR unit, a fourth AMR unit, a first magnetization direction setting device, and a second magnetization direction setting device. The conductive wire has a first conductive segment and a second conductive segment respectively disposed below a first end and a second end opposite to the first end of the substrate. The first AMR unit and the second AMR unit are disposed above the first end of the substrate. The third AMR unit and the fourth AMR unit are disposed above the second end of the substrate. The first magnetization direction setting device and the second magnetization direction setting device are configured to set magnetization directions of the AMR units.

10 Claims, 9 Drawing Sheets

ELECTRIC CURRENT SENSOR

CROSS-REFERENCE TO RELATED APPLICATION

This application claims the priority benefits of U.S. provisional application Ser. No. 62/721,624, filed on Aug. 23, 2018, and Taiwan application serial no. 108116112, filed on May 9, 2019. The entirety of each of the above-mentioned patent applications is hereby incorporated by reference herein and made a part of this specification.

BACKGROUND

Technical Field

The disclosure relates to a sensor; more particularly, the disclosure relates to an electric current sensor.

Description of Related Art

Electric current sensing is one of the indispensable factors in industrial automation. In recent years, the demand for the electric current sensing operation has been expanded from industrial use to consumer products and applications in smart home appliances and smart cities. High accuracy, fast response, small volume, low power consumption, and reliable quality are the goals pursued by the next-generation electric current sensors.

There are several ways to measure an electric current in a conductor. For instance, a shunt resistor can be used to estimate the electric current by measuring the voltage difference across the shunt resistor. However, said resistor has a small resistance and therefore consumes high power; as such, it is not suitable for small or portable devices. Besides, the high electric current generates heat and causes other problems.

SUMMARY

The disclosure provides an electric current sensor featuring high sensitivity, high accuracy, and low power consumption.

In an embodiment of the disclosure, an electric current sensor including a substrate, a conductive wire, a first anisotropic magnetoresistor (AMR) unit, a second AMR unit, a third AMR unit, a fourth AMR unit, a first magnetization direction setting device, and a second magnetization direction setting device. The conductive wire has a first conductive segment and a second conductive segment, wherein the first conductive segment and the second conductive segment are arranged in a first direction, respectively extended along a second direction, and respectively disposed below a first end and a second end opposite to the first end of the substrate. The first AMR unit and the second AMR unit are disposed above the first end of the substrate and arranged along the first direction. The third AMR unit and the fourth AMR unit are disposed above the second end of the substrate and arranged along a reverse direction of the first direction. The first magnetization direction setting device is configured to set magnetization directions of the first AMR unit and the second AMR unit. The second magnetization direction setting device is configured to set magnetization directions of the third AMR unit and the fourth AMR unit. When an electric current flows through the conductive wire, due to a magnetic field generated by the electric current, a resistance variation of the first AMR unit is opposite to a resistance variation of the second AMR unit, a resistance variation of the third AMR unit is opposite to a resistance variation of the fourth AMR unit, and the first, the second, the third, and the fourth AMR units are electrically connected to form a Wheatstone bridge to output a voltage signal corresponding to the resistance variations of the first, the second, the third, and the fourth AMR units.

In the electric current sensor provided in one or more embodiments of the disclosure, the AMR units are connected to form the Wheatstone bridge for sensing the magnetic field generated by the electric current in the conductive wire, and therefore the electric current sensing described herein is characterized by high sensitivity and high accuracy. Besides, the electric current sensor provided in one or more embodiments of the disclosure derives the amount of the electric current from sensing the magnetic field generated by the electric current, and the AMR units are not in direct contact with the electric current and thus consume less power.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

FIG. 4B is coupled to an operator.

DESCRIPTION OF THE EMBODIMENTS

Figure 1:
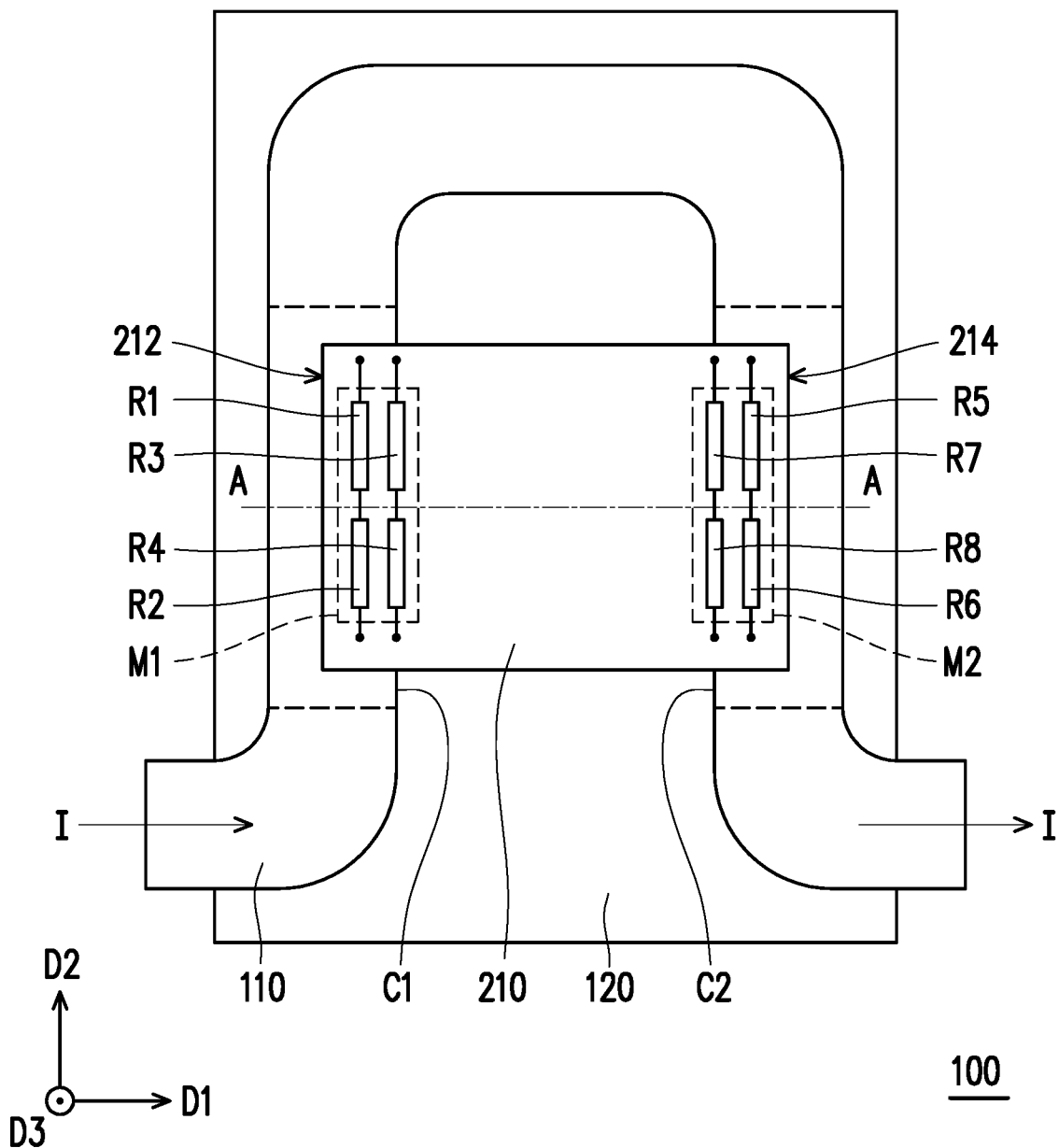
FIG. 1 is a schematic top view of an electric current sensor according to an embodiment of the disclosure.
Figure 2:
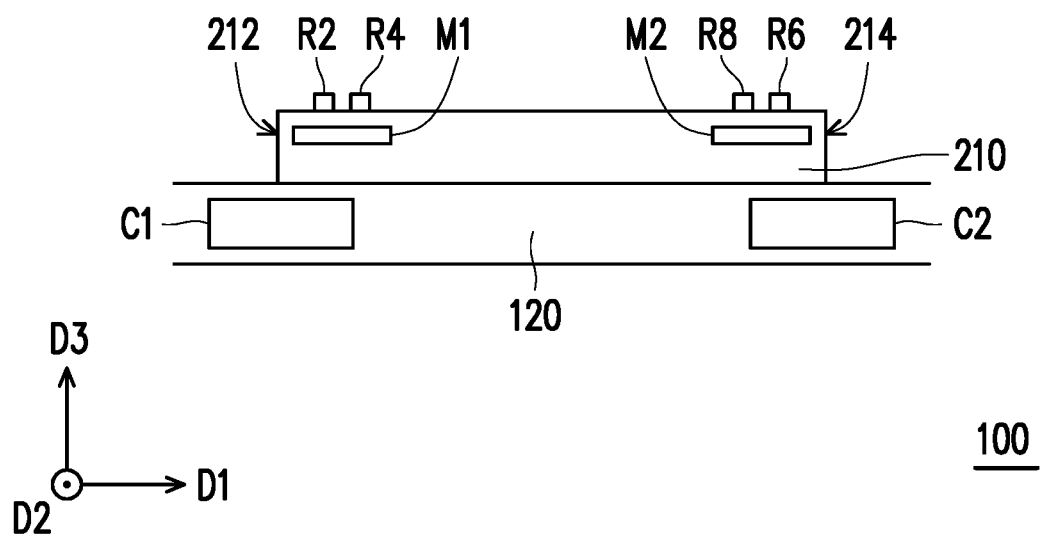
FIG. 2 is a schematic cross-sectional view illustrating the electric current sensor depicted in FIG. 1 along a line segment A-A.

FIG. 1 is a schematic top view of an electric current sensor according to an embodiment of the disclosure. FIG. 2 is a schematic cross-sectional view illustrating the electric current sensor depicted in FIG. 1 along a line segment A-A. With reference to FIG. 1 and FIG. 2, the electric current sensor 100 provided in the present embodiment includes a substrate 210, a conductive wire 110, a first anisotropic magnetoresistor (AMR) unit 222, a second AMR unit 224, a third AMR unit 226, a fourth AMR unit 228, a first magnetization direction setting device M1, and a second magnetization direction setting device M2. The conductive wire 110 has a first conductive segment C1 and a second conductive segment C2, wherein the first conductive segment C1 and the second conductive segment C2 are arranged in a first direction D1, respectively extended along a second direction D2, and respectively disposed below a first end 212 and a second end 214 opposite to the first end 212 of the substrate 210. The space where the electric current sensor 100 exists can be constructed by the first direction D1, the second direction D2, and a third direction D3 which are different from one another; in the present embodiment, the first direction D1, the second direction D2, and the third direction D3 can be perpendicular to one another. However, in other embodiments, the first direction D1, the second direction D2, and the third direction D3 can be different from one another but are not perpendicular to one another.

The first AMR unit 222 and the second AMR unit 224 are disposed above the first end 212 of the substrate 210 and arranged along the first direction D1. The third AMR unit 226 and the fourth AMR unit 228 are disposed above the second end 214 of the substrate 210 and arranged along the reverse direction of the first direction D1. The direction from the bottom of the first end 212 to the top of the first end 212 of the substrate 210 is the third direction D3.

The first magnetization direction setting device M1 is configured to set magnetization directions of the first AMR unit 222 and the second AMR unit 224. The second magnetization direction setting device M2 is configured to set magnetization directions of the third AMR unit 226 and the fourth AMR unit 228.

When an electric current I flows through the conductive wire 110, due to a magnetic field generated by the electric current I, a resistance variation of the first AMR unit 222 is opposite to a resistance variation of the second AMR unit 224, a resistance variation of the third AMR unit 226 is opposite to a resistance variation of the fourth AMR unit 228, and the first, the second, the third, and the fourth AMR units 222, 224, 226, and 228 are electrically connected to form a Wheatstone bridge to output a voltage signal corresponding to the resistance variations generated by the first, the second, the third, and the fourth AMR units 222, 224, 226, and 228.

In the present embodiment, the first AMR unit 222 includes a first AMR R1 and a second AMR R2 sequentially arranged along a reverse direction of the second direction D2, the second AMR unit 224 includes a third AMR R3 and a fourth AMR R4 sequentially arranged along the reverse direction of the second direction D2, the third AMR unit 226 includes a fifth AMR R5 and a sixth AMR R6 sequentially arranged along the reverse direction of the second direction D2, and the fourth AMR unit 228 includes a seventh AMR R7 and an eighth AMR R8 sequentially arranged along the reverse direction of the second direction D2. The number of the first to the eighth AMRs R1-R8 is respectively one, for instance; however, in other embodiments, each of the AMRs can be replaced by a plurality of serially connected AMRs. For instance, the first AMR R1 can be replaced by a plurality of serially connected first AMRs R1.

In the present embodiment, the first magnetization direction setting device M1, the second magnetization direction setting device M2, and the first to the fourth AMR units 222, 224, 226, and 228 can be disposed on the substrate 210, and the magnetization direction setting devices and the AMR units can be separated by an insulation layer. In the present embodiment, the first magnetization direction setting device M1 is disposed between the first and the second AMR units 222 and 224 and the first conductive segment C1, and the second magnetization direction setting device M2 is disposed between the third and the fourth AMR units 226 and 228 and the second conductive segment C2. However, in other embodiments, the first and the second AMR units 222 and 224 can be disposed between the first magnetization direction setting device M1 and the first conductive segment C1, and the third and the fourth AMR units 226 and 228 can be disposed between the second magnetization direction setting device M2 and the second conductive segment C2. Alternatively, in other embodiments, the first magnetization direction setting device M1 can be distributed above and below the first and the second AMR units 222 and 224, and the second magnetization direction setting device M2 can also be distributed above and below the third and the fourth AMR units 226 and 228.

Besides, the conductive wire 110 can be encapsulated by a package 120, while two ends of the conductive wire 110 are exposed outside the package 120; here, the package 120 is made of an insulation material, for instance. The substrate 210 can be disposed on the package 120.

Figure 3A:
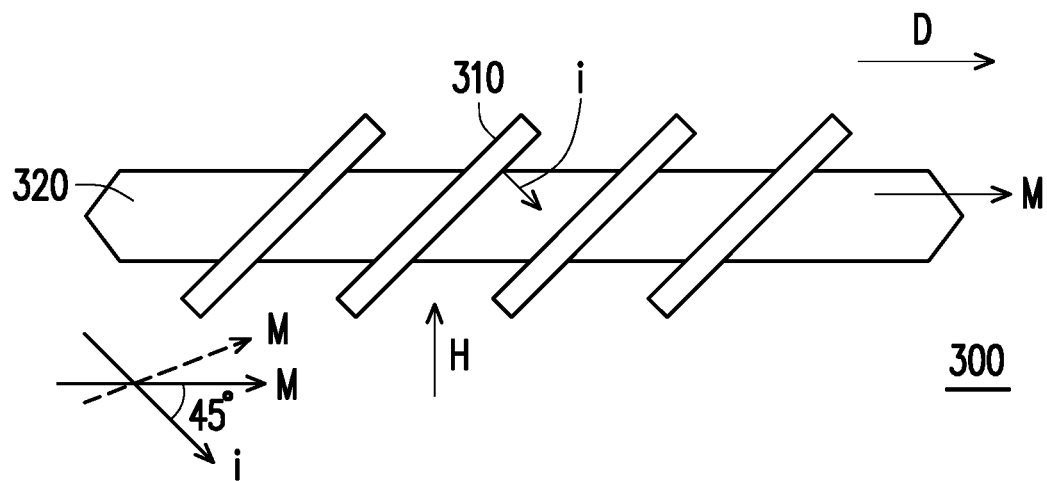
FIG. 3A and FIG. 3B are configured to explain operation principles of the anisotropic magnetoresistors (AMRs) in FIG. 1.
Figure 3B:
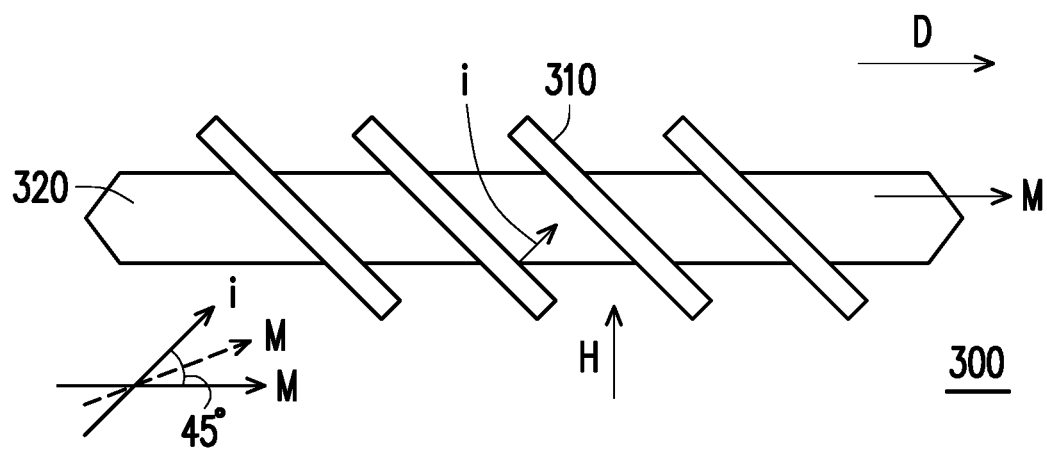

FIG. 3A and FIG. 3B are configured to explain operation principles of the AMRs in FIG. 1. With reference to FIG. 3A, the AMR 300 has a structure shaped as a barber pole; namely, a plurality of electrical shorting bars 310 extending at a 45-degree angle inclined relative to an extension direction D of the AMR 300 are disposed on a surface of the AMR 300, and the electrical shorting bars 310 are spaced apart from each other and arranged on a ferromagnetic film 320 in parallel. The ferromagnetic film 320 is the main body of the AMR 300, and an extension direction of the ferromagnetic film 320 is the extension direction D of the AMR 300. Additionally, two opposite ends of the ferromagnetic film 320 can be shaped as tips.

Before the AMR 300 starts to measure an external magnetic field H, the magnetization direction setting device (e.g., the first magnetization direction setting device M1 or the second magnetization direction setting device M2 depicted in FIG. 1) can be applied to set a magnetization direction of the AMR 300, wherein the magnetization direction setting device is, for instance, a conductive wire, a metal sheet, a conductor, or a coil that can generate a magnetic field when an electric current passes therethrough. In FIG. 3A, the magnetization direction setting device can generate the magnetic field along the extension direction D when an electric current passes therethrough, so that the AMR 300 can have the magnetization direction M.

No electric current then flows through the magnetization direction setting device, so as to allow the AMR 300 to start measuring the external magnetic field H. When there is no external magnetic field H, the magnetization direction M of the AMR 300 stays in the extension direction D; at this time, an electric current i is applied to flow from the left end to the right end of the AMR 300, and the flow direction of the electric current i around the electrical shorting bars 310 is perpendicular to the extension direction of the electrical shorting bars 310, whereby the included angle between the flow direction of the electric current i around the electrical shorting bars 310 and the magnetization direction M is 45 degrees, and the resistance of the AMR 300 at this time is R.

When there is an external magnetic field H toward a direction perpendicular to the extension direction D, the magnetization direction M of the AMR 300 deflects toward the direction of the external magnetic field H, so that the included angle between the flow direction of the electric current i around the electrical shorting bars 310 and the magnetization direction M is greater than 45 degrees; at this time, the resistance of the AMR 300 has a variation of $-\Delta R$, and becomes R−ΔR. That is, the resistance decreases, wherein ΔR is greater than zero.

However, as shown in FIG. 3B, when the included angle between the extension direction of the electrical shorting bars 310 as shown in FIG. 3B and the extension direction of the electrical shorting bars 310 as shown in FIG. 3A is 90 degrees (here, the included angle between the extension direction of the electrical shorting bars 310 as shown in FIG. 3B and the extension direction D of the AMR 300 is still 45 degrees), and when the external magnetic field H exists, the external magnetic field H makes the magnetization direction M deflect toward the direction of the external magnetic field H. At this time, the included angle between the magnetization direction M and the flow direction of the electric current i around the electrical shorting bars 310 is less than 45 degrees. As such, the resistance of the AMR 300 becomes R+ΔR, i.e., the resistance of the AMR 300 increases.

Additionally, when the magnetization direction setting device is applied to set the magnetization direction M of the AMR 300 as the reverse direction of the direction shown in FIG. 3A, the resistance of the AMR 300 in FIG. 3A then becomes R+ΔR while the external magnetic field H exists. Moreover, when the magnetization direction setting device is applied to set the magnetization direction M of the AMR 300 as the reverse direction of the direction shown in FIG. 3B, the resistance of the AMR 300 in FIG. 3B then becomes R−ΔR while the external magnetic field H exists.

From the above, it can be learned that the variation of the resistance R of the AMR 300 corresponding to the external magnetic field H is changed from +ΔR to −ΔR or vice versa when the direction in which the electrical shorting bars 310 are arranged is changed, and when the magnetization direction M set by the magnetization direction setting device is changed to the reverse direction, the variation of the resistance R of the AMR 300 corresponding to the external magnetic field H is changed from +ΔR to −ΔR or vice versa. When the direction of the external magnetic field H is changed to the reverse direction, the variation of the resistance R of the AMR 300 corresponding to the external magnetic field H is changed from +ΔR to −ΔR or vice versa. However, when the direction of the electric current i flowing through the AMR 300 is reversed, the variation of the resistance R of the AMR 300 corresponding to the external magnetic field H remains without changing the positive/negative sign, i.e., if the original variation is +ΔR, the variation remains at +ΔR while the direction of the electric current i is reversed; if the original variation is −ΔR, the variation remains at −ΔR while the direction of the electric current i is reversed.

According to said principles, when the AMR 300 is subject to a certain component of the external magnetic field H, the variation direction of the resistance R of the AMR 300 can be determined through designing the extension direction of the electrical shorting bars 310 or the magnetization direction M set by the magnetization direction setting device, i.e., the increase or decrease of the resistance R (e.g., the variation +ΔR or −ΔR).

Figure 4A:
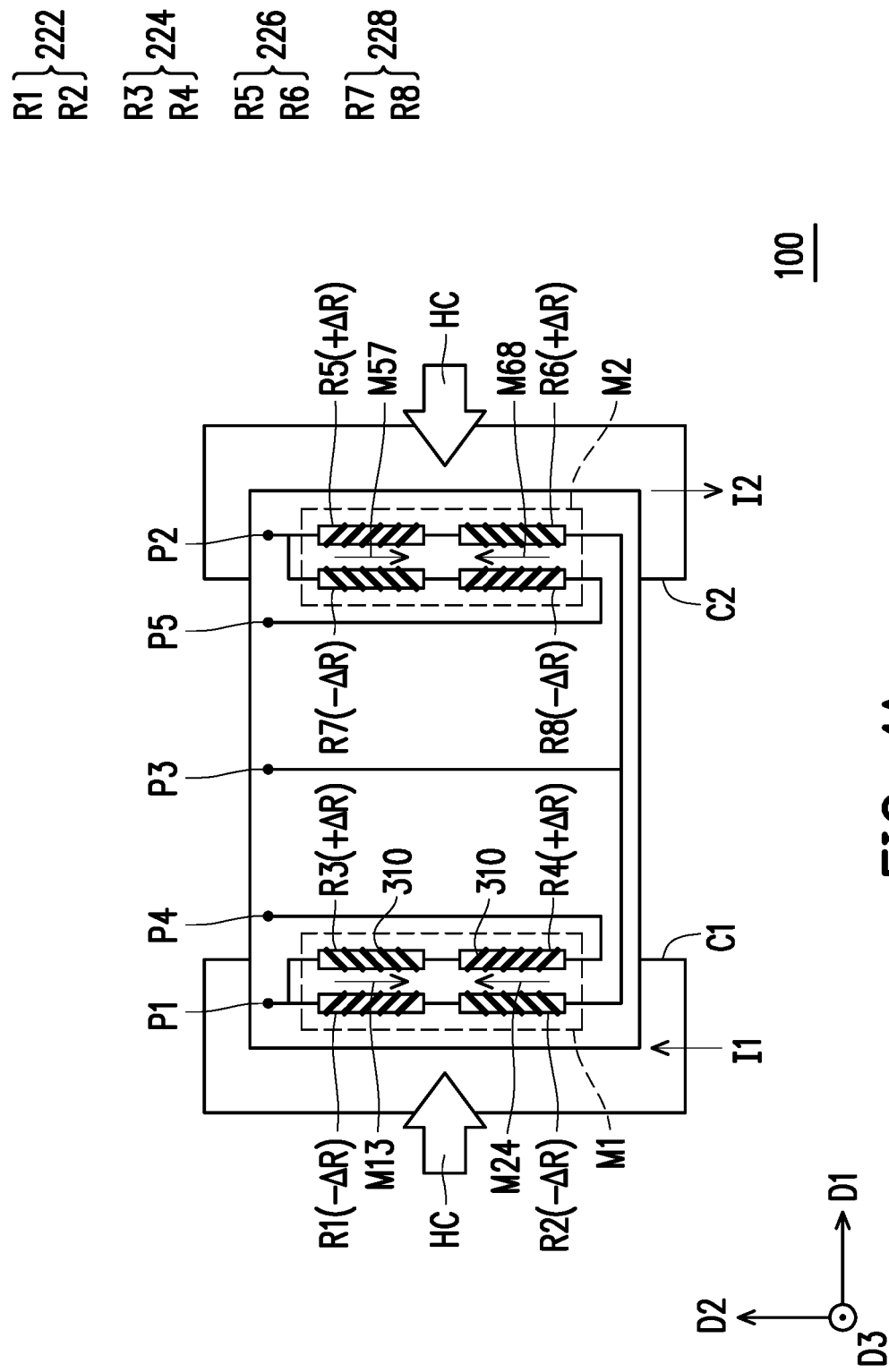
FIG. 4A and FIG. 4B respectively illustrate magnetization directions of the AMRs of the electric current sensor depicted in FIG. 1 at a first timing and a second timing and following resistance variations.
Figure 4B:
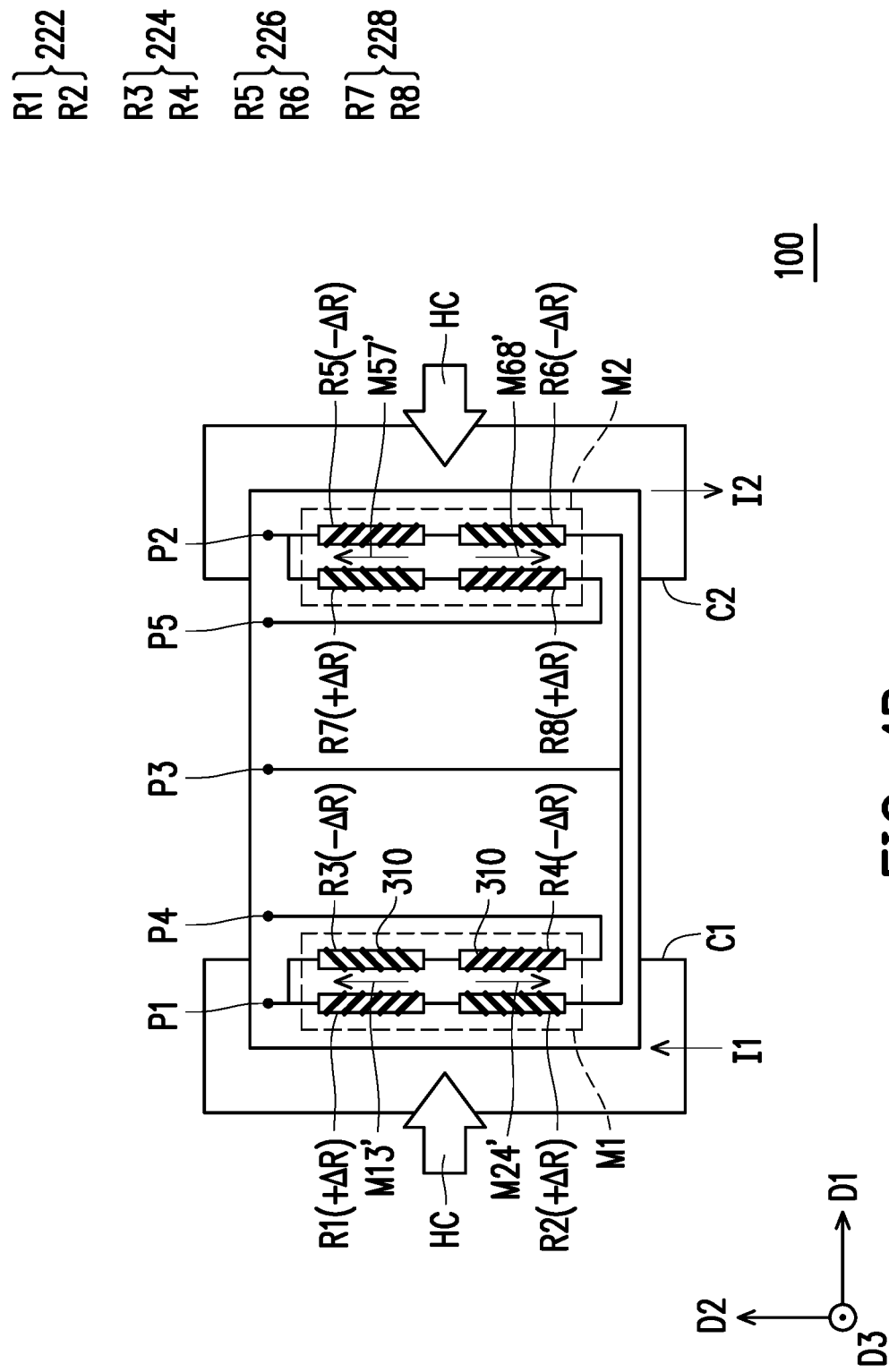

FIG. 4A and FIG. 4B respectively illustrate magnetization directions of the AMRs of the electric current sensor depicted in FIG. 1 at a first timing and a second timing and following resistance variations. Note that the extension directions of the electrical shorting bars in the first to the eighth AMRs R1-R8 are also depicted. With reference to FIG. 4A and FIG. 4B, in the present embodiment, the extension directions of the first to the eighth AMRs R1-R8 are the second direction D2, and the extension directions of the electrical shorting bars 310 therein are shown in FIG. 4A. Specifically, the included angles between the extension directions of the electrical shorting bars 310 and the second direction D2 are 45 degrees in two different directions, and the two different directions are parallel to a plane defined by the first direction D1 and the second direction D2.

When the electric current I (as shown in FIG. 1) flows through the conductive wire 110, the direction of the electric current I1 in the first conductive segment C1 and the direction of the electric current I2 in the second conductive segment C2 are the second direction D2 and the reverse direction of the second direction D2, respectively, for instance. At this time, a magnetic field component HC along the first direction D1 is generated by the electric current I1 on the first to the fourth AMRs R1-R4, and a magnetic field component HC along the reverse direction of the first direction D1 is generated by the electric current I2 on the fifth to the eighth AMRs R5-R8. In the present embodiment, the amount of the electric current I1 is equal to the amount of the electric current I2. Besides, in the present embodiment, when the electric current I flows through the conductive wire 110, the flow direction of the electric current I in the first conductive segment C1 (i.e., the flow direction of the electric current I1) is opposite to the flow direction of the electric current I in the second conductive segment C2 (i.e., the flow direction of the electric current I2). In addition, according to the present embodiment, when the electric current I1 flows through the first conductive segment C1, a component direction (i.e., the magnetic field component HC which is toward the first direction D1 and shown on the left-hand side in FIG. 4A and FIG. 4B) of the magnetic field generated at the first AMR unit 222 and the second AMR unit 224 in the first direction D1 is opposite to a component direction (i.e., the magnetic field component HC which is toward the reverse direction of the first direction D1 and shown on the right-hand side in FIG. 4A and FIG. 4B) of the magnetic field generated at the third AMR unit 226 and the fourth AMR unit 228 in the first direction D1 when the electric current I2 flows through the second conductive segment C2.

At a first timing, the first magnetization direction setting device M1 sets the magnetization direction M13 of the first AMR R1 and the third AMR R3 as the reverse direction of the second direction D2 and sets the magnetization direction M24 of the second AMR R2 and the fourth AMR R4 as the second direction D2. Besides, at the first timing, the second magnetization direction setting device M2 sets the magnetization direction M57 of the fifth AMR R5 and seventh AMR R7 as the reverse direction of the second direction D2 and sets the magnetization direction M68 of the sixth AMR R6 and the eighth AMR R8 as the second direction D2. In the present embodiment, the first magnetization direction setting device M1 and the second magnetization direction setting device M2 are, for instance, conductive wires, conductive sheets (e.g., metal sheets), conductors, or conductive coils that can generate the magnetic field by electric currents passing therethrough; any conductive structure that is able to generate the magnetic field along the magnetization directions M13, M24, M57, and M68 can serve as the first magnetization direction setting device M1 and the second magnetization direction setting device M2.

After the first timing, the first magnetization direction setting device M1 and the second magnetization direction setting device M2 stop generating the magnetic field; for instance, no electric current flows through the first magnetization direction setting device M1 and the second magnetization direction setting device M2, and thus no magnetic field is generated. At this time, the first to the fourth AMRs R1-R4 can respectively have the resistance variations $-\Delta R$, $-\Delta R$, $+\Delta R$, and $+\Delta R$ due to the magnetic field component HC generated by the electric current I1, and the fifth to the eighth AMRs R5-R8 can respectively have the resistance variations $+\Delta R$, $+\Delta R$, $-\Delta R$, and $-\Delta R$ due to the magnetic field component HC generated by the electric current I2.

According to the present embodiment, the first AMR R1, the second AMR R2, the sixth AMR R6, and the fifth AMR R5 can be sequentially connected in series from the contact P1 to the contact P2, and the contact P3 can be electrically connected to a conductive path between the second AMR R2 and the sixth AMR R6, the third AMR R3 and the fourth AMR R4 can be sequentially connected in series from the contact P1 to the contact P4, and the seventh AMR R7 and the eighth AMR R8 can be sequentially connected in series from the contact P2 to the contact P5. The contact P3 can receive a reference voltage VDD, and the contact P4 and the contact P5 can be grounded; at this time, a Wheatstone bridge is formed, and the voltage difference between the contact P1 and the contact P2 in the Wheatstone bridge is (VDD)×($\Delta R/R$) and can be an output signal, and the output signal is a differential signal whose value corresponds to the value of the magnetic field component HC and further corresponds to the amount of the electric current I flowing through the conductive wire 110. The output signal is referred to as a first voltage signal $V_1$ hereinafter. In another embodiment, the contact P3 can be grounded, while the contact P4 and the contact P5 receive the reference voltage VDD.

At a second timing following the first timing, the first magnetization direction setting device M1 sets the magnetization direction M13' of the first AMR R1 and the third AMR R3 as the second direction D2 and sets the magnetization direction M24' of the second AMR R2 and the fourth AMR R4 as the reverse direction of the second direction D2. Besides, at the second timing, the second magnetization direction setting device M2 sets the magnetization direction M57' of the fifth AMR R5 and the seventh AMR R7 as the second direction D2 and sets the magnetization direction M68' of the sixth AMR R6 and the eighth AMR R8 as the reverse direction of the second direction D2.

After the second timing, the first magnetization direction setting device M1 and the second magnetization direction setting device M2 stop generating the magnetic field; at this time, the first to the fourth AMRs R1-R4 can respectively have the resistance variations $+\Delta R$, $+\Delta R$, $-\Delta R$, and $-\Delta R$ due to the magnetic field component HC generated by the electric current I1, and the fifth to the eighth AMRs R5-R8 can respectively have the resistance variations $-\Delta R$, $-\Delta R$, $+\Delta R$, and $+\Delta R$ due to the magnetic field component HC generated by the electric current I2. At this time, a Wheatstone bridge is formed, and the voltage difference between the contact P1 and the contact P2 in the Wheatstone bridge is (VDD)×($-\Delta R/R$) and can be an output signal, and the output signal is a differential signal whose value corresponds to the value of the magnetic field component HC and further corresponds to the amount of the electric current I flowing through the conductive wire 110. The output signal is referred to as a second voltage signal $V_2$ hereinafter.

Figure 5:
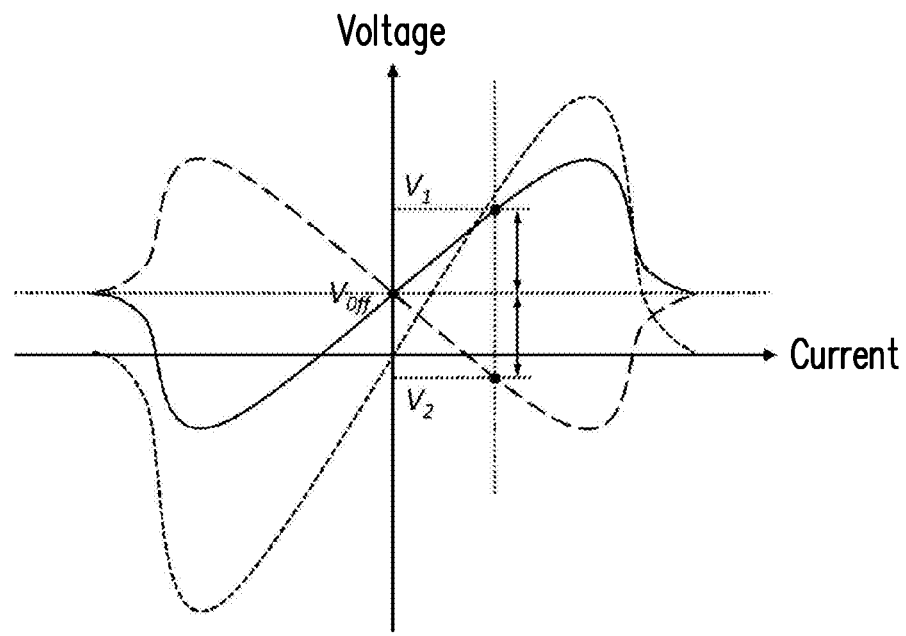
FIG. 5 is an output voltage-current curve of the Wheatstone bridge depicted in FIG. 4A and FIG. 4B.
Figure 6:
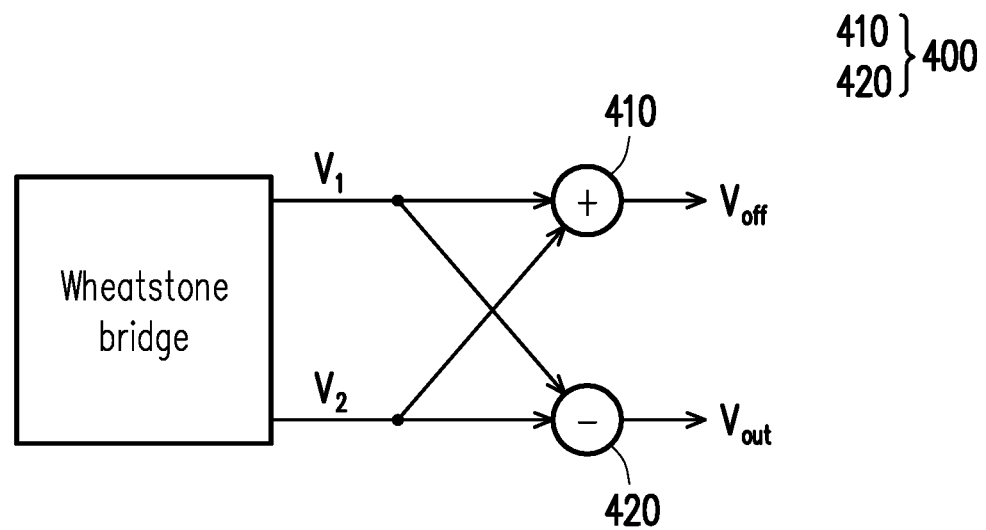
FIG. 6 illustrates that the Wheatstone bridge depicted in FIG. 4A

FIG. 5 is an output voltage-current curve of the Wheatstone bridge depicted in FIG. 4A and FIG. 4B. FIG. 6 illustrates that the Wheatstone bridge depicted in FIG. 4A and FIG. 4B is coupled to an operator. With reference to FIG. 4A, FIG. 4B, FIG. 5, and FIG. 6, in the present embodiment, the electric current sensor 100 further includes an operator 400 electrically connected to an output terminal of the Wheatstone bridge (i.e., receives the first voltage signal $V_1$ and the second voltage signal $V_2$), wherein the first magnetization direction setting device M1 and the second magnetization direction setting device M2 set a combination of magnetization directions of the first, the second, the third, and the fourth AMR units 222, 224, 226, and 228 as a first combination (i.e., the combination of the magnetization direction M13, the magnetization direction M24, the magnetization direction M57, and the magnetization direction M68 shown in FIG. 4A), so as to allow the Wheatstone bridge to subsequently output the first voltage signal $V_1$. The first magnetization direction setting device M1 and the second magnetization direction setting device M2 then set the combination of the magnetization directions of the first, the second, the third, and the fourth AMR units 222, 224, 226, and 228 as a second combination (i.e., the combination of the magnetization direction M13', the magnetization direction M24', the magnetization direction M57', and the magnetization direction M68' shown in FIG. 4B) opposite to the first combination, so as to allow the Wheatstone bridge to subsequently output the second voltage signal $V_2$. The operator 400 is configured to subtract the first voltage signal $V_1$ from the second voltage signal $V_2$ or subtract the second voltage signal $V_2$ from the first voltage signal $V_1$, so as to output an output voltage signal $V_{out}$ corresponding to a magnitude of the magnetic field generated by the electric current I. Besides, in the present embodiment, the operator 400 can be configured to add the first voltage signal $V_1$ and the second voltage signal $V_2$ to output an offset voltage signal $V_{off}$.

Specifically, the operator 400 can include an arithmetic operator 410 and an arithmetic operator 420, wherein the arithmetic operator 410 is, for instance, an adder configured to add the first voltage signal $V_1$ and the second voltage signal $V_2$, so as to output the offset voltage signal $V_{off}$. In another aspect, the arithmetic operator 420 is, for instance, a subtractor configured to subtract the first voltage signal $V_1$ from the second voltage signal $V_2$ or subtract the second voltage signal $V_2$ from the first voltage signal $V_1$, so as to output the output voltage signal $V_{out}$ corresponding to the magnitude of the magnetic field generated by the electric current I.

It can be learned from FIG. 5 that there may be an offset voltage signal $V_{off}$ in the output voltage-current curve of the Wheatstone bridge, and after the first voltage signal $V_1$ and the second voltage signal $V_2$ are added, the offset voltage signal $V_{off}$ is left; besides, after the first voltage signal $V_1$ is subtracted from the second voltage signal $V_2$ or vice versa, the output voltage-current curve passes through a point where the values of the voltage and the electric current are both zero. Thereby, the voltage and the electric current are almost proportional within a certain range, so that the resistance variation $\Delta R$ can be precisely estimated through the output voltage signal $V_{out}$.

In the present embodiment, the contacts P1-P5 and the operator 400 exist in the substrate 210, for instance, and the substrate 210 is a circuit substrate, e.g., a semiconductor substrate.

Figure 7:
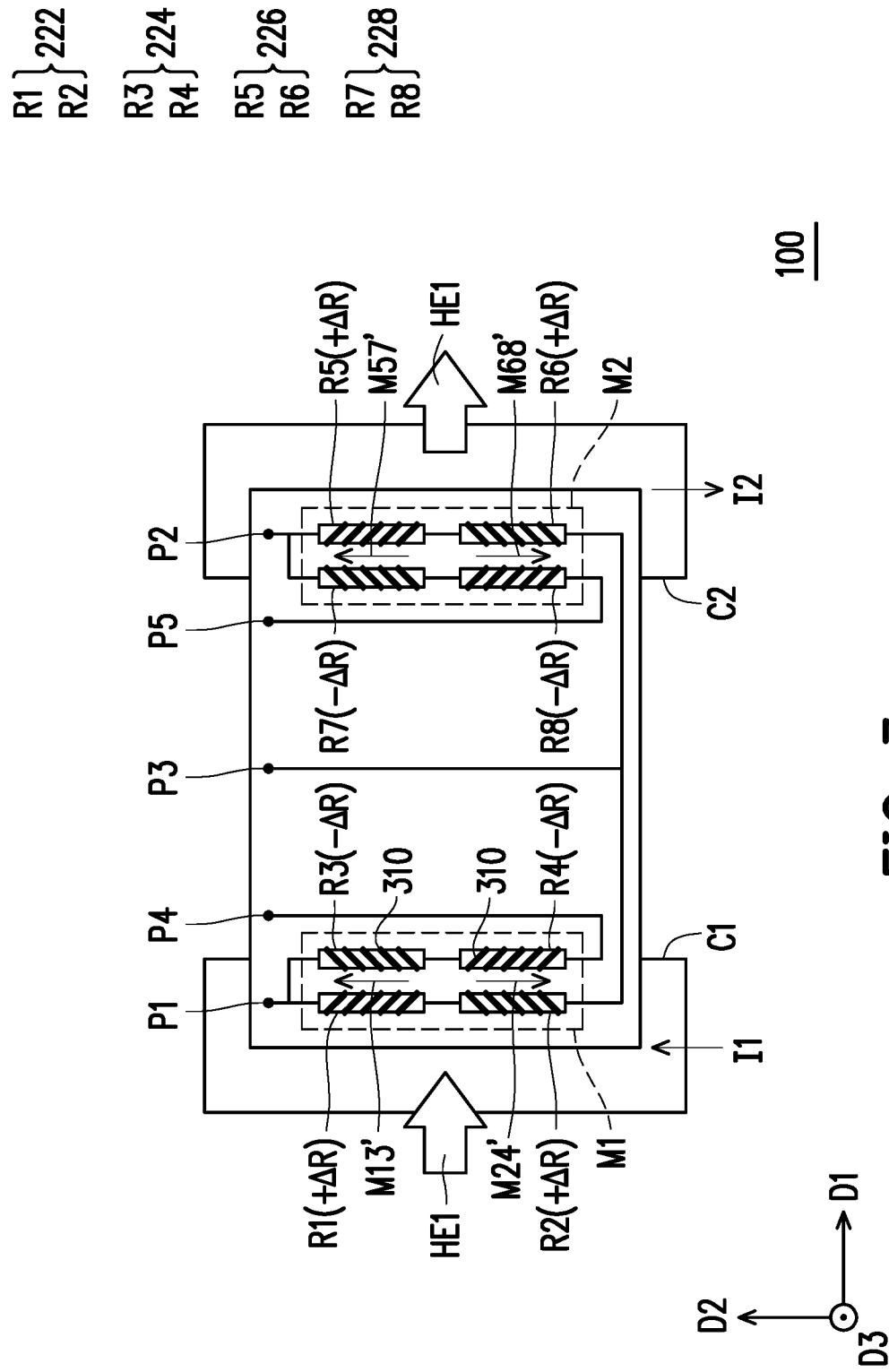
FIG. 7, FIG. 8, and FIG. 9 respectively illustrate magnetization directions of the AMRs of the electric current sensor depicted in FIG. 1 at the second timing and following resistance variations while external magnetic field components in three different directions are given.
Figure 8:
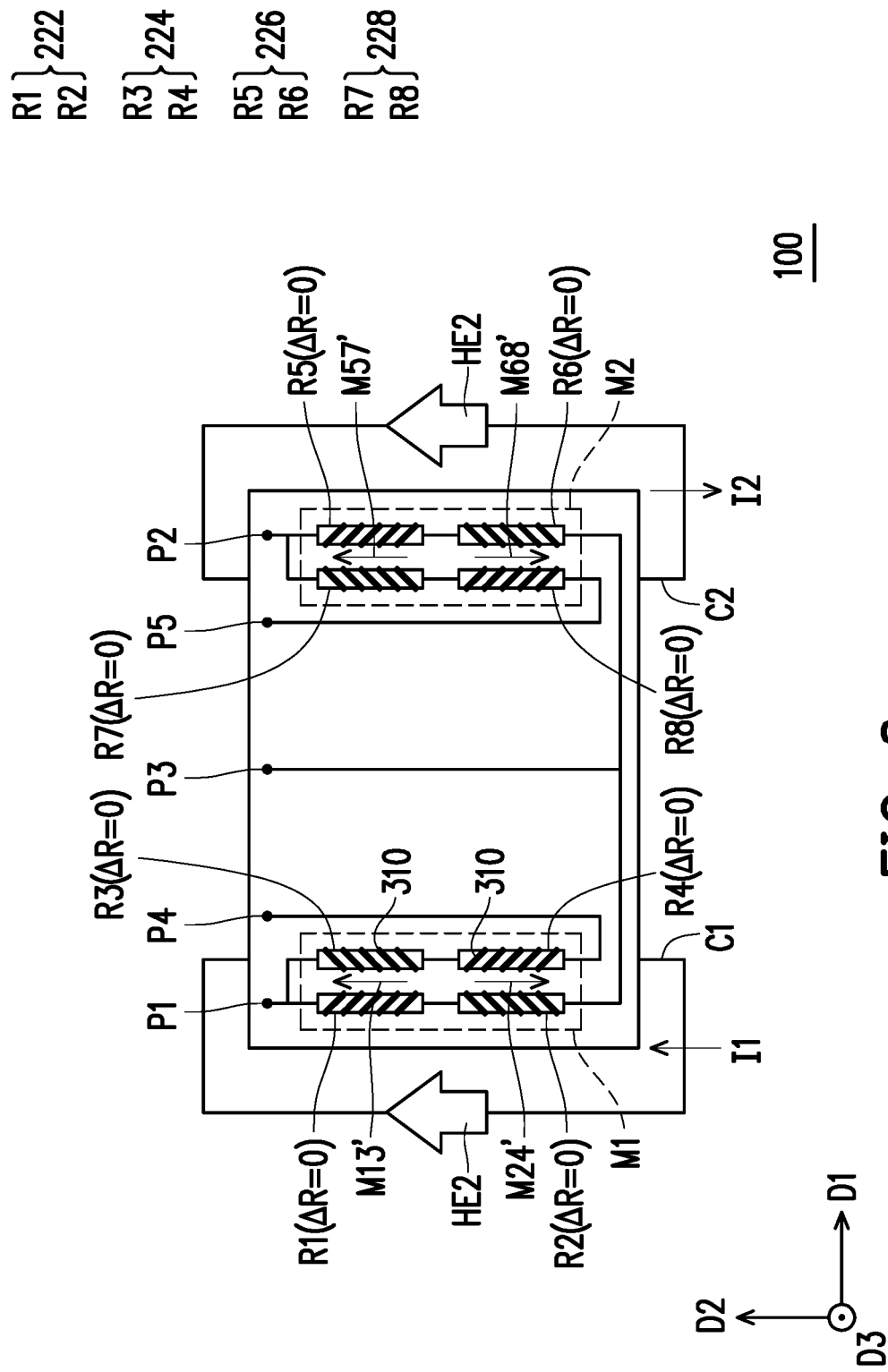
Figure 9:
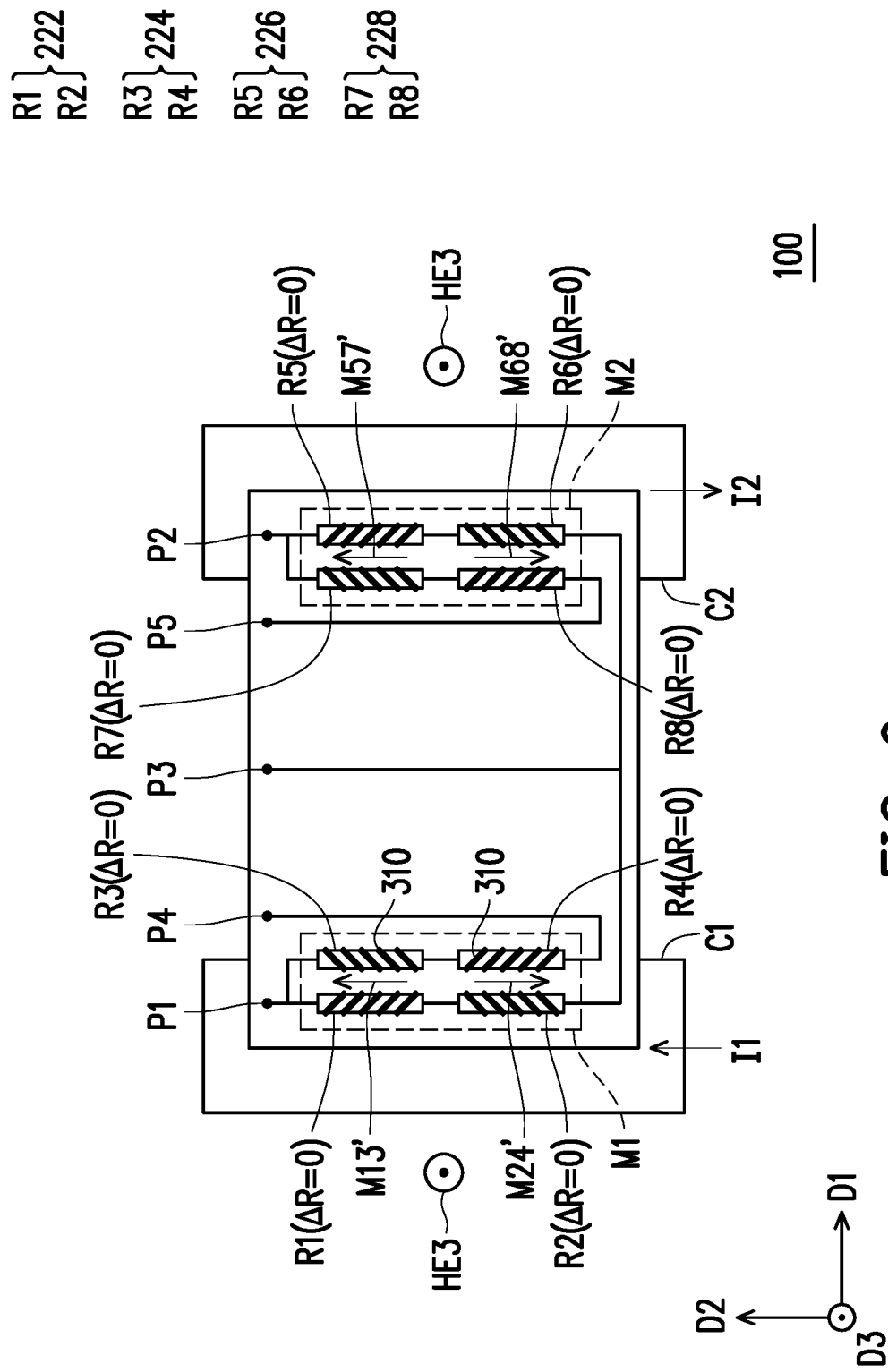

FIG. 7, FIG. 8, and FIG. 9 respectively illustrate magnetization directions of the AMRs of the electric current sensor depicted in FIG. 1 at the second timing and following resistance variations while external magnetic field components in three different directions are given. With reference to FIG. 7, after the first magnetization direction setting device M1 and the second magnetization direction setting device M2 completely set the magnetization directions M13', M24', M57', and M68' at the second timing, and when there is an external magnetic field component HE1 along the first direction D1, the resistance variations of the first to the eighths AMRs R1-R8 are +ΔR, +ΔR, −ΔR, −ΔR, +ΔR, +ΔR, −ΔR, and −ΔR, respectively; thereby, when the contact P3 receives the reference voltage VDD, and the contact P4 and the contact P5 are grounded, the voltage difference between the contact P1 and the contact P2 in the Wheatstone bridge is zero.

With reference to FIG. 8, after the first magnetization direction setting device M1 and the second magnetization direction setting device M2 at the second timing completely set the magnetization directions M13', M24', M57', and M68', and when there is an external magnetic field component HE2 along the second direction D2, the resistance variations of the first to the eighth AMRs R1-R8 are zero. This is because the second direction D2 is not a direction can be sensed by the first to the eighth AMRs R1-R8. As such, when the contact P3 receives the reference voltage VDD, and the contact P4 and the contact P5 are grounded, the voltage difference between the contact P1 and the contact P2 in the Wheatstone bridge is zero.

With reference to FIG. 9, after the first magnetization direction setting device M1 and the second magnetization direction setting device M2 completely set the magnetization directions M13', M24', M57', and M68' at the second timing, and when there is an external magnetic field component HE3 along the third direction D3, the resistance variations of the first to the eighth AMRs R1-R8 are zero. This is because the third direction D3 is not a direction can be sensed by the first to the eighth AMRs R1-R8. As such, when the contact P3 receives the reference voltage VDD, and the contact P4 and the contact P5 are grounded, the voltage difference between the contact P1 and the contact P2 in the Wheatstone bridge is zero.

That is, in the present embodiment, an output voltage signal of the Wheatstone bridge corresponding to the external magnetic field component HE1 in the first direction D1 is zero, an output voltage signal of the Wheatstone bridge corresponding to the external magnetic field component HE2 in the second direction D2 is zero, and an output voltage signal of the Wheatstone bridge corresponding to the external magnetic field component HE3 in the third direction D3 is zero. Therefore, no matter which direction the external magnetic field is in, the sensing result of the electric current sensor 100 provided in the present embodiment is not affected, i.e., there is no interference in the output voltage of the electric current sensor 100.

The reaction of the Wheatstone bridge after the second timing is exemplified to explain how the Wheatstone bridge reacts with the external magnetic field components HE1, HE2, and HE3. After the first timing, i.e., after the first magnetization direction setting device M1 and the second magnetization direction setting device M2 completely set the magnetization directions M13, M24, M57, and M68 at the first timing, as shown in FIG. 4A, the resistance variations of the first to the eighth AMRs R1-R8 in response to the external magnetic field component HE1 are −ΔR, −ΔR, +ΔR, +ΔR, −ΔR, −ΔR, +ΔR, and +ΔR. As such, when the contact P3 receives the reference voltage VDD, and the contact P4 and the contact P5 are grounded, the voltage difference between the contact P1 and the contact P2 in the Wheatstone bridge is zero. Since the first to the eighth AMRs R1-R8 are not affected by the external magnetic field components HE2 and HE3, no resistance variation is generated, and the voltage difference between the contact P1 and the contact P2 in the Wheatstone bridge is still zero. As a result, the external magnetic field in any direction does not interfere with the electric current sensor 100 provided in one or more embodiments of the disclosure after the first timing or after the second timing.

A feedback coil may also be disposed in or on the substrate 210 and is at least partially overlapped with the first to the eighth AMRs R1-R8 for close-loop control.

To sum up, in the electric current sensor provided in one or more embodiments of the disclosure, the AMR units are connected to form the Wheatstone bridge for sensing the magnetic field generated by the electric current in the conductive wire, and therefore the electric current sensing described herein is characterized by high sensitivity and high accuracy. Besides, the electric current sensor provided in one or more embodiments of the disclosure derives the amount of the electric current from sensing the magnetic field generated by the electric current, and the AMR units are not in direct contact with the electric current and thus consume less power.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electric current sensor comprising:
    a substrate;
    a conductive wire having a first conductive segment and a second conductive segment, wherein the first conductive segment and the second conductive segment are arranged in a first direction, respectively extended along a second direction, and respectively disposed below a first end and a second end opposite to the first end of the substrate;
    a first anisotropic magnetoresistor unit and a second anisotropic magnetoresistor unit, disposed above the first end of the substrate and arranged along the first direction;
    a third anisotropic magnetoresistor unit and a fourth anisotropic magnetoresistor unit, disposed above the second end of the substrate and arranged along a reverse direction of the first direction;
    a first magnetization direction setting device configured to set magnetization directions of the first anisotropic magnetoresistor unit and the second anisotropic magnetoresistor unit; and
    a second magnetization direction setting device configured to set magnetization directions of the third anisotropic magnetoresistor unit and the fourth anisotropic magnetoresistor unit,
    wherein when an electric current flows through the conductive wire, due to a magnetic field generated by the electric current, a resistance variation of the first anisotropic magnetoresistor unit is opposite to a resistance variation of the second anisotropic magnetoresistor unit, a resistance variation of the third anisotropic magnetoresistor unit is opposite to a resistance variation of the fourth anisotropic magnetoresistor unit, and the first, the second, the third, and the fourth anisotropic magnetoresistor units are electrically connected to form a Wheatstone bridge to output a voltage signal corresponding to the resistance variations of the first, the second, the third, and the fourth anisotropic magnetoresistor units.

2. The electric current sensor according to claim 1, further comprising an operator electrically connected to an output terminal of the Wheatstone bridge, wherein the first magnetization direction setting device and the second magnetization direction setting device set a combination of the magnetization directions of the first, the second, the third, and the fourth anisotropic magnetoresistor units as a first combination to allow the Wheatstone bridge to subsequently output a first voltage signal, and the first magnetization direction setting device and the second magnetization direction setting device then set a combination of the magnetization directions of the first, the second, the third, and the fourth anisotropic magnetoresistor units as a second combination opposite to the first combination to allow the Wheatstone bridge to subsequently output a second voltage signal, wherein the operator is configured to subtract the second voltage signal from the first voltage signal or subtract the first voltage signal from the second voltage signal to output an output voltage signal corresponding to a magnitude of the magnetic field generated by the electric current.

3. The electric current sensor according to claim 2, wherein the operator is configured to add the first voltage signal and the second voltage signal to output an offset voltage signal.

4. The electric current sensor according to claim 1, wherein when the electric current flows through the conductive wire, a flow direction of the electric current in the first conductive segment is opposite to a flow direction of the electric current in the second conductive segment.

5. The electric current sensor according to claim 1, wherein the first direction is perpendicular to the second direction.

6. The electric current sensor according to claim 1, wherein when the electric current flows through the first conductive segment, a component direction of the magnetic field generated at the first anisotropic magnetoresistor unit and the second anisotropic magnetoresistor unit in the first direction is opposite to a component direction of the magnetic field generated at the third anisotropic magnetoresistor unit and the fourth anisotropic magnetoresistor unit in the first direction when the electric current flows through the second conductive segment.

7. The electric current sensor according to claim 6, wherein output voltage signals of the Wheatstone bridge corresponding to an external magnetic field component in the first direction, in the second direction, and in a third direction are zero, respectively, and the third direction is perpendicular to the first direction and the second direction.

8. The electric current sensor according to claim 1, wherein the first anisotropic magnetoresistor unit comprises a first anisotropic magnetoresistor and a second anisotropic magnetoresistor sequentially arranged along a reverse direction of the second direction, the second anisotropic magnetoresistor unit comprises a third anisotropic magnetoresistor and a fourth anisotropic magnetoresistor sequentially arranged along the reverse direction of the second direction, the third anisotropic magnetoresistor unit comprises a fifth anisotropic magnetoresistor and a sixth anisotropic magnetoresistor sequentially arranged along the reverse direction of the second direction, and the fourth anisotropic magnetoresistor unit comprises a seventh anisotropic magnetoresistor and an eighth anisotropic magnetoresistor sequentially arranged along the reverse direction of the second direction.

9. The electric current sensor according to claim 8, wherein at a first timing, the first magnetization direction setting device sets magnetization directions of the first anisotropic magnetoresistor and the third anisotropic magnetoresistor as the reverse direction of the second direction and sets magnetization directions of the second anisotropic magnetoresistor and the fourth anisotropic magnetoresistor as the second direction; at the first timing, the second magnetization direction setting device sets magnetization directions of the fifth anisotropic magnetoresistor and the seventh anisotropic magnetoresistor as the reverse direction of the second direction and sets magnetization directions of the sixth anisotropic magnetoresistor and the eighth anisotropic magnetoresistor as the second direction; at a second timing, the first magnetization direction setting device sets the magnetization directions of the first anisotropic magnetoresistor and the third anisotropic magnetoresistor as the second direction and sets the magnetization directions of the second anisotropic magnetoresistor and the fourth anisotropic magnetoresistor as the reverse direction of the second direction; at the second timing, the second magnetization direction setting device sets the magnetization directions of the fifth anisotropic magnetoresistor and the seventh anisotropic magnetoresistor as the second direction and sets the magnetization directions of the sixth anisotropic magnetoresistor and the eighth anisotropic magnetoresistor as the reverse direction of the second direction.

10. The electric current sensor according to claim 1, wherein the first magnetization direction setting device and the second magnetization direction setting device are conductive sheets, conductive coils, conductive wires, or conductors.

* * * * *

UNITED STATES PATENT AND TRADEMARK OFFICE
CERTIFICATE OF CORRECTION

PATENT NO. : 10,866,267 B2
APPLICATION NO. : 16/527075
DATED : December 15, 2020
INVENTOR(S) : Fu-Te Yuan Page 1 of 1

It is certified that error appears in the above-identified patent and that said Letters Patent is hereby corrected as shown below:

On the Title Page

Item (71) Applicant should read: Fu-Te Yuan, New Taipei City (TW)

Item (72) Inventor should read: Fu-Te Yuan, New Taipei City (TW)

Item (73) Assignee should read: iSentek Inc., New Taipei City (TW)

Signed and Sealed this
Twenty-seventh Day of April, 2021

Drew Hirshfeld
*Performing the Functions and Duties of the*
*Under Secretary of Commerce for Intellectual Property and*
*Director of the United States Patent and Trademark Office*